United States Patent [19]

MacDougall

[11] 4,418,974

[45] Dec. 6, 1983

[54] LOW INSERTION FORCE SOCKET ASSEMBLY

[75] Inventor: Alan R. MacDougall, Harrisburg, Pa.

[73] Assignee: AMP Incorporated, Harrisburg, Pa.

[21] Appl. No.: 276,423

[22] Filed: Jun. 22, 1981

Related U.S. Application Data

[63] Continuation-in-part of Ser. No. 229,044, Jan. 28, 1981, Pat. No. 4,377,319.

[51] Int. Cl.³ .......................................... H01R 13/631
[52] U.S. Cl. .............................. 339/75 M; 339/17 CF
[58] Field of Search ............ 339/17 CF, 74 R, 75 M, 339/75 MP, 176 MP

[56] References Cited

U.S. PATENT DOCUMENTS

| | | | |
|---|---|---|---|
| 3,526,869 | 9/1970 | Conrad et al. | 339/75 MP |
| 3,553,630 | 1/1971 | Scheingold et al. | 339/74 |
| 3,602,875 | 8/1971 | Pierini | 339/192 R |
| 4,080,032 | 3/1978 | Cherian et al. | 339/176 MP |
| 4,189,199 | 2/1980 | Grau | 339/17 CF |
| 4,288,139 | 9/1981 | Cobaugh et al. | 339/74 R |

FOREIGN PATENT DOCUMENTS 2443939  3/1975  Fed. Rep. of Germany ... 339/17 CF

*Primary Examiner*—John McQuade
*Attorney, Agent, or Firm*—Gerald K. Kita

[57] ABSTRACT

A Low Insertion Force Socket Assembly includes a base (2), cavities (24), electrical contacts (4) in the cavities, rails (6)(8) which engage and close the receptacles onto electrical leads (46) of an electronic package (48) and a reciprocating cam (12) integral with a cover (10) and latches (42) and a detent finger (44) and pilot holes (36A)(36B)(36C) for aligning the parts during assembly.

4 Claims, 7 Drawing Figures

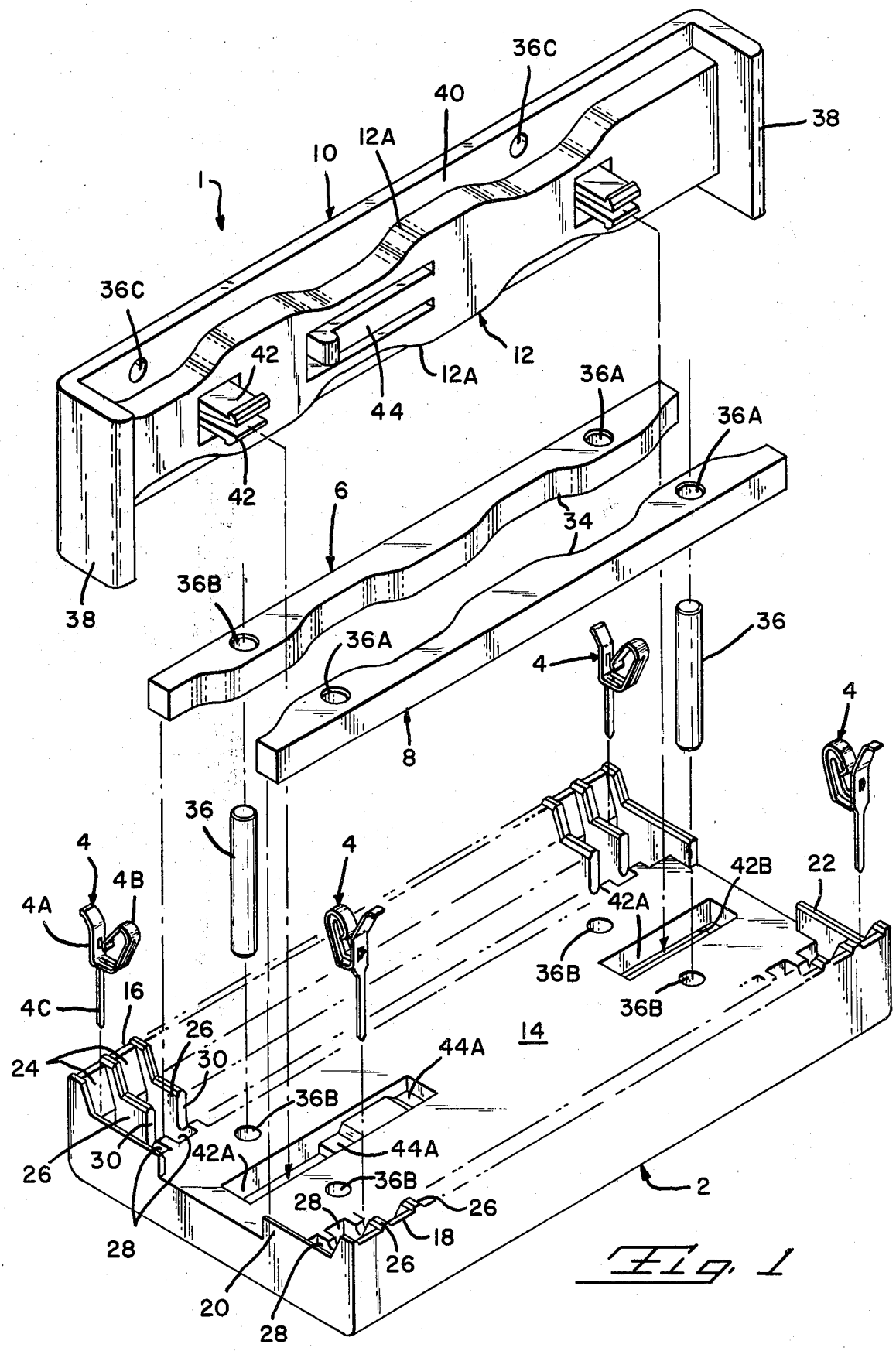

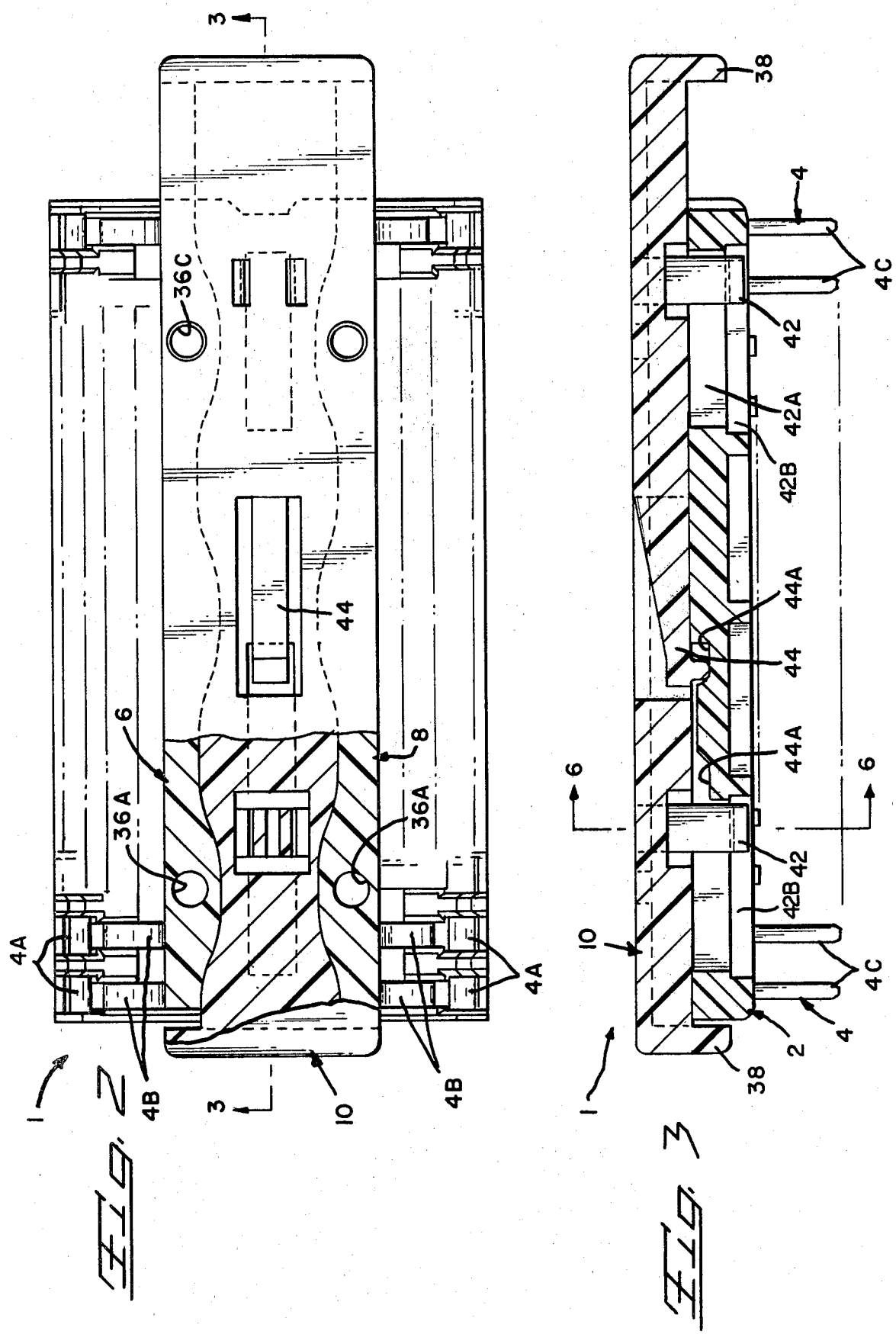

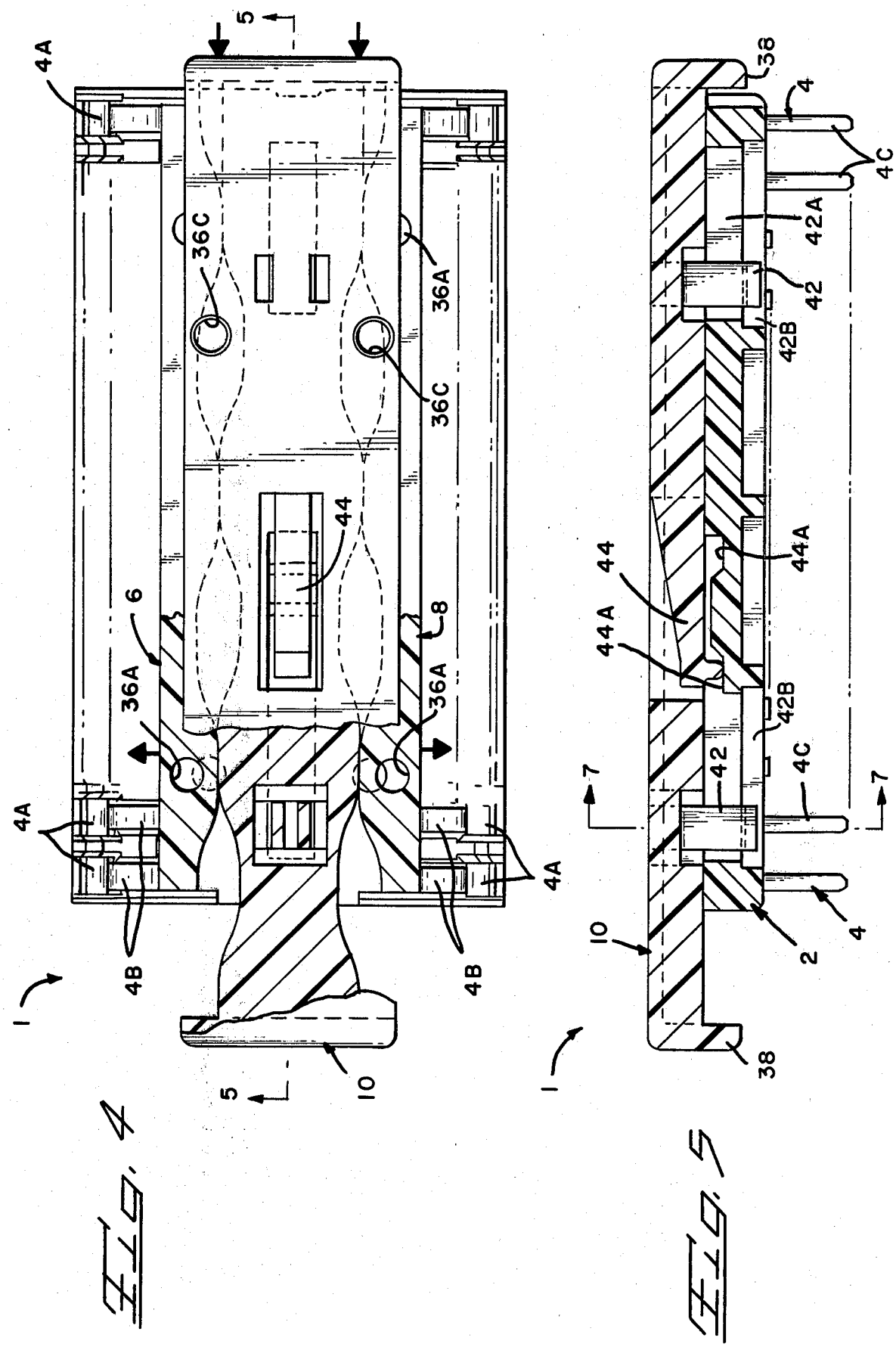

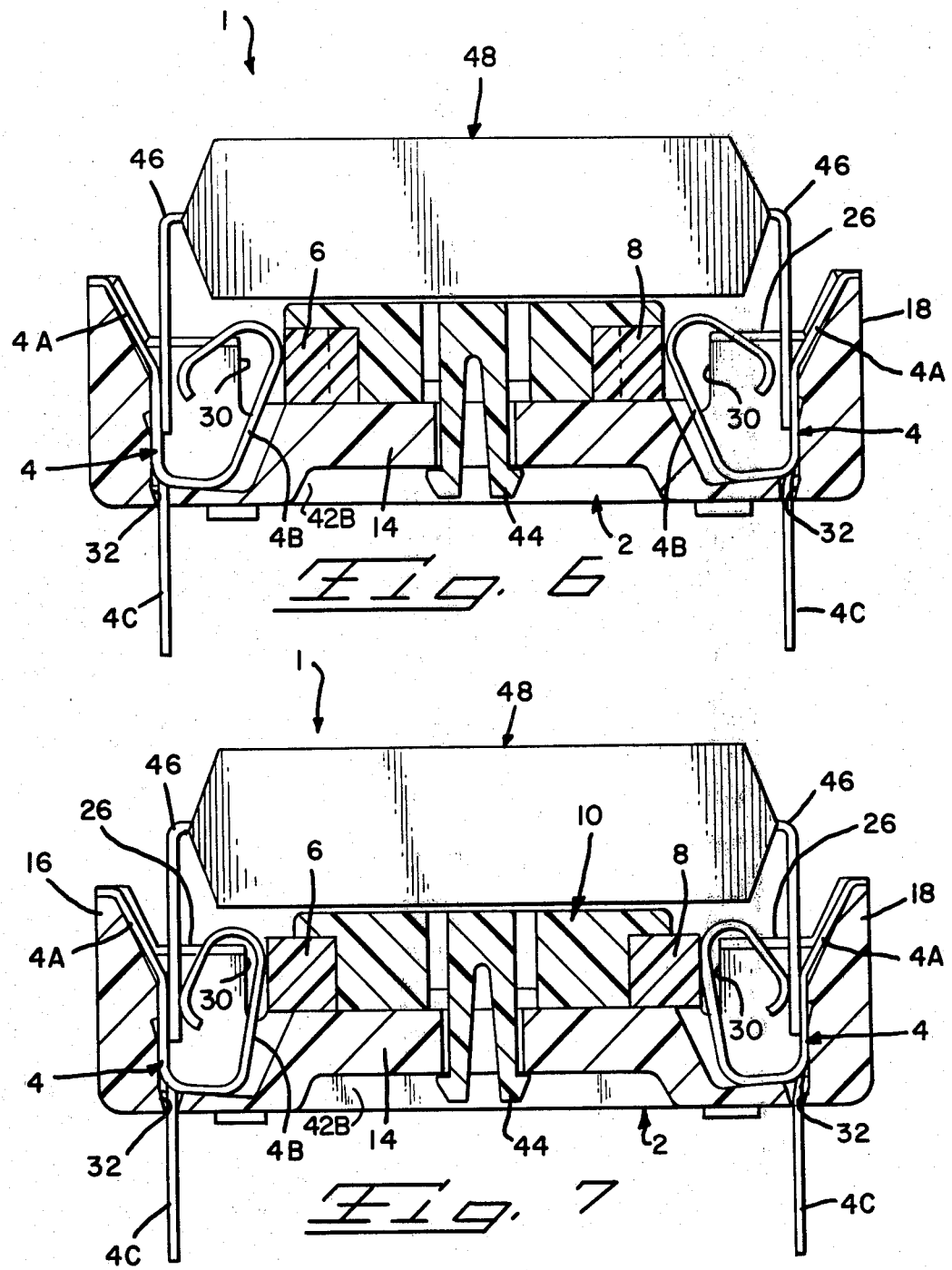

LOW INSERTION FORCE SOCKET ASSEMBLY

RELATED APPLICATION

This application is a continuation-in-part of application Ser. No. 06/229,044, Filed Jan. 28, 1981, now U.S. Pat. No. 4,377,319.

FIELD OF THE INVENTION

The present invention relates to an electrical socket assembly for electrical terminals, called leads, projecting from an electronic package.

BACKGROUND OF THE PRIOR ART

By way of example, an electronic package comprises miniature electrical circuit components interconnected by and mounted on a metal lead frame. The lead frame has projecting multiple terminals, called leads. The circuit components are imbedded in encapsulant. The leads project from the encapsulant and provide connections for electrical inputs and outputs to the circuit components in the package.

A socket assembly for an electronic package allows pluggable connection of the leads of the package with circuits of a printed circuit board. A typical socket assembly includes an insulation base carrying electrical receptacle contacts that are connected with respective circuits of a printed circuit board. The leads of the electronic package are pluggably inserted into the receptacle contacts and are readily withdrawn to remove the electronic package from the socket assembly. The receptacle contacts often are damaged when the leads of the package are inserted, especially if the terminals are misaligned slightly with the receptacle contacts and the misaligned leads are forced into the receptacle contacts.

There is known in U.S. Pat. No. 3,763,459 a low insertion force socket into which misaligned leads are inserted without damaging the receptacle contacts of the socket. This advantage is achieved by having the receptacle contacts open during insertion of the misaligned leads. A reciprocating shutter mechanism is operated to close the receptacle contacts onto the leads and establish electrical connections therewith. The shutter mechanism also allows opening of the receptacle contacts to permit withdrawal of the leads. In this known socket the receptacle contacts must be received into respective apertures of the shutter mechanism. Assembly of the shutter mechanism apertures over the receptacle contacts is difficult especially if the socket is of miniature size. Another problem to overcome is the need for reducing the number of component parts required in the assembly.

The present invention is a low insertion force socket assembly having parts few in number and of minimum complexity, comprising a base, contact receiving cavities in the base along sides of the base, an electrical contact in each of the cavities, each of the contacts having a pair of opposed fingers spaced apart for receiving therebetween an electrical terminal, and the fingers of each of the contacts engage opposite sides of a respective terminal upon resilient deflection of one resilient finger of each contact toward the other finger of the contact, characterized in that; a pair of elongated rails are mounted on the base alongside the resilient fingers of respective contacts, each rail has an elongated sinuous follower surface, a cover overlies the rails, a cam on the cover is interposed between the rails, the cam has sinuous edges facing the sinuous follower surfaces of the rails, and upon reciprocation of the cam together with the cover, the sinuous edges of the cam slidably traverse against the sinuous follower surfaces of the rails, and the rails engage and resiliently reflect the resilient fingers of the contacts toward the opposed fingers.

The present invention is further characterized in that, the base includes an elongated slot, the cover includes a resilient projecting finger in detented engagement with each of the recesses, alternately in turn, upon reciprocation of the cam together with the cover.

The present invention is further characterized in that, the cover and the cam are of one piece molded dielectric construction, the latch and the finger are cantilever beams joined integrally with the cover.

The present invention is further characterized in that the base and the rails and the cover have pilot holes therein which align with one another as an indicator of correct assembly of the base, the rails, and the cover.

An object of the present invention is to provide a low insertion force socket assembly for electrical leads of an electronic package in which the assembly comprises a base, electrical receptacle contacts, a pair of rails, and a cover combined with a cam, latches and a detent mechanism.

Other objects and advantages of the present invention are apparent by way of example from the following detailed description taken in conjunction with the drawings.

FIG. 1 is an enlarged perspective view of a socket assembly with the parts exploded for the purposes of illustration.

FIG. 2 is a plan view of the assembly with the parts assembled and a cover and a cam partially broken away and in section for the purpose of illustrating the cam in a first, detented position, and the receptacle contacts are shown as being open.

FIG. 3 is a side elevation of the assembly as shown in FIG. 2, and with the assembly shown in section taken along the line 3—3 of FIG. 2.

FIG. 4 is an enlarged plan view similar to FIG. 2 and illustrating the cam in a second detented position, and the receptacle contacts closed.

FIG. 5 is a view similar to FIG. 3 with the assembly shown in section taken along the line 5—5 of FIG. 4.

FIG. 6 is an enlarged elevation of the assembly shown in section taken along the line 6—6 of FIG. 3.

FIG. 7 is a view similar to FIG. 6 with the assembly shown in section taken along the line 7—7 of FIG. 5.

By way of example, FIG. 1 shows a socket assembly (1), comprising a base (2), electrical receptacle contacts (4), a pair of rails (6)(8) and a cover (10) having a cam (12). The base (2) is of one piece molded plastic construction having a flat central table (14) encircled by projecting side walls (16)(18) and end walls (20)(22). Alongside the sidewall (16) is a row of open cavities (24) recessed into the base (2) and separated by partitions (26). The cavities project, at (28), past end walls (30) of the partitions (26) and partially into the table (14). Alongside the sidewall (18) is another row of open cavities (24) similar in all respects to the cavities (24) which are alongside the sidewall (16). Additional partitions (26) on the sidewall (18) separate the cavities (24).

Each contact (4) is stamped and formed in one piece from a blank of resilient, conductive metal, and comprises a first finger (4A) and a second, resilient finger (4B) which is doubled back on itself and projects toward the finger (4A). A projecting post type terminal (4C) is partially severed out from the finger (4B) and remains attached at one end to the finger (4B). The fingers (4A)(4B) of each contact are opposed and are spaced apart from each other, and define an open electrical receptacle.

As shown in FIGS. 1, 2 and 6, each contact (4) is mounted in a respective cavity (24). A finger (4A) lies against a respective sidewall (16) or (18). Since the wall (16) or (18) is tapered, the finger (4A) is flared and defines a funnel entry into the electrical receptacle defined by the opposed fingers (4A) and (4B). The resilient finger (4B) of each contact (4) projects into the portion (28) of a respective cavity. Each finger (4B) extends past the end walls (30) of the partitions (26) and projects partially into the table (14). The terminal (4C) of each contact (4) projects through a respective slot (32) in the bottom of each cavity (24) through the base (2).

With reference to FIG. 1, the rails (6)(8) are of elongate, molded plastic construction, each having a sinuous cam follower surface (34) and a pair of spaced apart pilot holes (36A). FIGS. 2 and 6 show the rails (6)(8) mounted on the table (14) alongside respective resilient fingers (4B) of the contacts (4). FIG. 1 shows the table (4) of the base (2) having pilot holes (36B). The pilot holes (36B) may have removable alignment pins (36) which align with the pilot holes (36A) of the rails (6)(8) during assembly with the base (2).

With reference to FIG. 1, the cover (10) and cam (12) are of unitary, one piece, molded plastic construction. The cover includes end walls (38) which project out from a plate portion (40) in which are provided pilot holes (36C). The cam (12) projects out from the plate portion (40) and is provided with sinuous edges (12A) on opposite elongated sides of the cam (12). The cover (10) also includes resilient L-shaped latches (42) and a resilient, L-shaped detent finger (44) projecting through and beyond the cam (12). The table (14) has a pair of slots (42A) communicating with recessed (42B) under the table (14), and a pair of recessed (44A) to receive the detent finger (44).

FIGS. 2 and 6 show the assembly of the cover (10) and cam (12) on the base (2). The pilot holes (36C) of the cover are aligned with the alignment pins (36), and the cover is urged toward the table (14) until the L-shaped latches (42) pass through the slots (42A) and hook in recesses (42B) under the table (14). The cam (12) is then interposed between the rails (6)(8) with the edges (12A) facing and nesting with the follower surfaces (34). FIG. 3 shows the detent finger (44) in detented registration with a first recess (44A). Following assembly, the pilot pins (36) are removed, since they are not needed.

The assembly (1) as shown in FIGS. 2, 3 and 6, provides a low insertion force socket for electrical terminals in the form of leads (46) of a known electronic package (48). The leads (46) are readily inserted, without undue force, into the open receptacles defined by the opposed fingers (4A)(4B) of the contacts (4). FIGS. 4, 5 and 7 show the cam (12) together with the cover (10) reciprocated to a second position, with the detent finger (44) transferred from detented registration in a first (44A) to a second recess (44A). As the cam is reciprocated the latches (42) slide in in the slots (42A). In addition, the sinuous edges (12A) of the cam (12) slidably traverse against the sinuous follower surfaces (34) of the rails (6)(8), and the rails engage and deflect the resilient fingers (4B) of the contacts (4) toward the opposed fingers (4A). Thereby the fingers (4A) (4B) engage opposite sides of respective leads (46) to establish electrical connections therewith. The cam (12) together with the cover (10) is reciprocated to the first position shown in FIGS. 2, 3 and 6, allowing the receptacles to open by return resilient deflection of the fingers (4B). The fingers also open resiliently due to resilient stored spring energy, and thereby push against the rails, and return the rails (6)(8) to their positions shown in FIGS. 2, 3 and 6.

Although a preferred embodiment of the present invention is disclosed, other embodiments and modifications thereof which would be apparent to one having ordinary skill are intended to be covered by the spirit and scope of the appended claims.

I claim:

1. A low insertion force socket assembly having a base, contact receiving cavities in the base along sides of the base, an electrical contact in each of the cavities, each of the contacts having a pair of opposed fingers spaced apart for receiving therebetween an electrical terminal, and the fingers of each of the contacts engaging opposite sides of a respective terminal upon resilient deflection of one resilient finger of each contact toward the other finger of the contact, characterized in that;

a pair of elongate rails are mounted on the base alongside the resilient fingers of respective contacts, each rail having an elongate sinuous follower surface, a cover overlying the rails, a cam on the cover being interposed between the rails, the cam having sinuous edges facing the sinuous follower surfaces of the rails, so that reciprocation of the cam together with the cover causes the sinuous edges of the cam slidably to traverse against the sinuous follower surfaces of the rails, and the rails to deflect the resilient fingers of the contacts toward the opposed fingers; the base including an elongate slot and the cover including a projecting resilient latch hooked in the slot; for reciprocal sliding movement along the slot during reciprocation of the cam together with the cover to secure the cover to the base.

2. A socket assembly according to claim 1 further characterized in that, the base includes a pair of spaced apart recesses facing toward the cover, and the cover includes a resilient projecting finger in detented engagement with each of the recesses, alternately, during reciprocation of the cam together with the cover.

3. A socket assembly according to claim 1 2, further characterized in that, the cover and the cam are of one piece molded dielectric construction, the latch and the finger of the cover are cantilever beams joined integrally with the cover.

4. A socket assembly according to claim 1 or claim 2 further characterized in that, the base and the rails and the cover have pilot holes therein which align with one another as an indicator of correct assembly of the base, the rails, and the cover.

* * * * *